(12) United States Patent
Oman

(10) Patent No.: US 7,821,123 B2
(45) Date of Patent: Oct. 26, 2010

(54) LED ARRAY COOLING SYSTEM

(75) Inventor: Todd P. Oman, Greentown, IN (US)

(73) Assignee: Delphi Technologies, Inc., Troy, MI (US)

( * ) Notice: Subject to any disclaimer, the term of this patent is extended or adjusted under 35 U.S.C. 154(b) by 1004 days.

(21) Appl. No.: 11/225,288

(22) Filed: Sep. 13, 2005

(65) Prior Publication Data

US 2007/0057267 A1 Mar. 15, 2007

(51) Int. Cl.
*H01L 23/34* (2006.01)
*H01L 21/00* (2006.01)
*H05K 7/20* (2006.01)

(52) U.S. Cl. .................. 257/706; 257/712; 257/717; 257/720; 361/707; 361/711; 361/717; 438/122

(58) Field of Classification Search .................. None
See application file for complete search history.

(56) References Cited

U.S. PATENT DOCUMENTS

| | | | | |
|---|---|---|---|---|
| 6,535,398 | B1 * | 3/2003 | Moresco | 361/792 |
| 6,936,855 | B1 * | 8/2005 | Harrah | 257/88 |
| 7,114,837 | B2 * | 10/2006 | Yagi et al. | 362/523 |
| 7,137,696 | B2 * | 11/2006 | Siegel | 347/102 |
| 7,188,985 | B2 * | 3/2007 | Ishida | 362/548 |
| 7,211,299 | B2 * | 5/2007 | Siegel | 427/493 |
| 7,237,936 | B1 * | 7/2007 | Gibson | 362/547 |
| 2005/0230820 | A1 * | 10/2005 | Licht | 257/720 |
| 2007/0105212 | A1 * | 5/2007 | Oldham et al. | 435/288.7 |

* cited by examiner

*Primary Examiner*—Alonzo Chambliss
(74) *Attorney, Agent, or Firm*—Jimmy L. Funke

(57) ABSTRACT

A LED array cooling system including a LED array and a substrate attached to the LED array wherein the LED array includes a plurality of walls that at least in part define a plurality of passages through the LED array.

14 Claims, 8 Drawing Sheets

LED ARRAY COOLING SYSTEM

BACKGROUND

This invention generally relates to heat transfer systems and more particularly relates to systems for cooling LED arrays.

Many applications which use infrared cameras depend on infrared light emitted from LED arrays to illuminate the subject whose image is being captured by the infrared camera. Infrared cameras are often used in imaging applications associated with vehicle safety systems to determine the presence (or absence) of a passenger in one or more locations within a vehicle. Infrared imaging systems are also used in automobile applications in what is known as "driver gaze systems." Driver gaze systems are systems that monitor driver eye and head movement to determine if the driver is falling asleep or otherwise becoming inattentive to his driving responsibilities.

By their nature, infrared cameras can operate at an optimal efficiency only if the light received by the camera falls within an optimum wavelength range. If an infrared camera is operated outside of its optimum wavelength range, its efficiency degrades significantly. For example, many infrared cameras operate optimally in a wavelength band centered around 940 nm. In order to obtain the optimal performance from the infrared camera, the infrared LED array used to illuminate the subject, should have a spectral irradiance maximum centered on or about the 940 nm wavelength point. Although such ideal matching between camera and LED array can be achieved in the laboratory setting, such ideal conditions cannot typically be met within a vehicle passenger compartment inasmuch as unregulated passenger compartment temperatures can vary anywhere from −40 degrees C. to 85 degrees C. and LED arrays have a significant wavelength shift vs. temperature dependence (typically about 0.25 nm/° C.). When a vehicle HVAC system is operational, typical cabin temperatures vary within a much narrower range (typically 22 degrees C.+/−5 degrees C.).

The present invention takes advantage of the moderating temperatures provided by the HVAC system within the vehicle to moderate the temperature of the LED array.

DETAILED DESCRIPTION OF THE INVENTION

Figure 1:
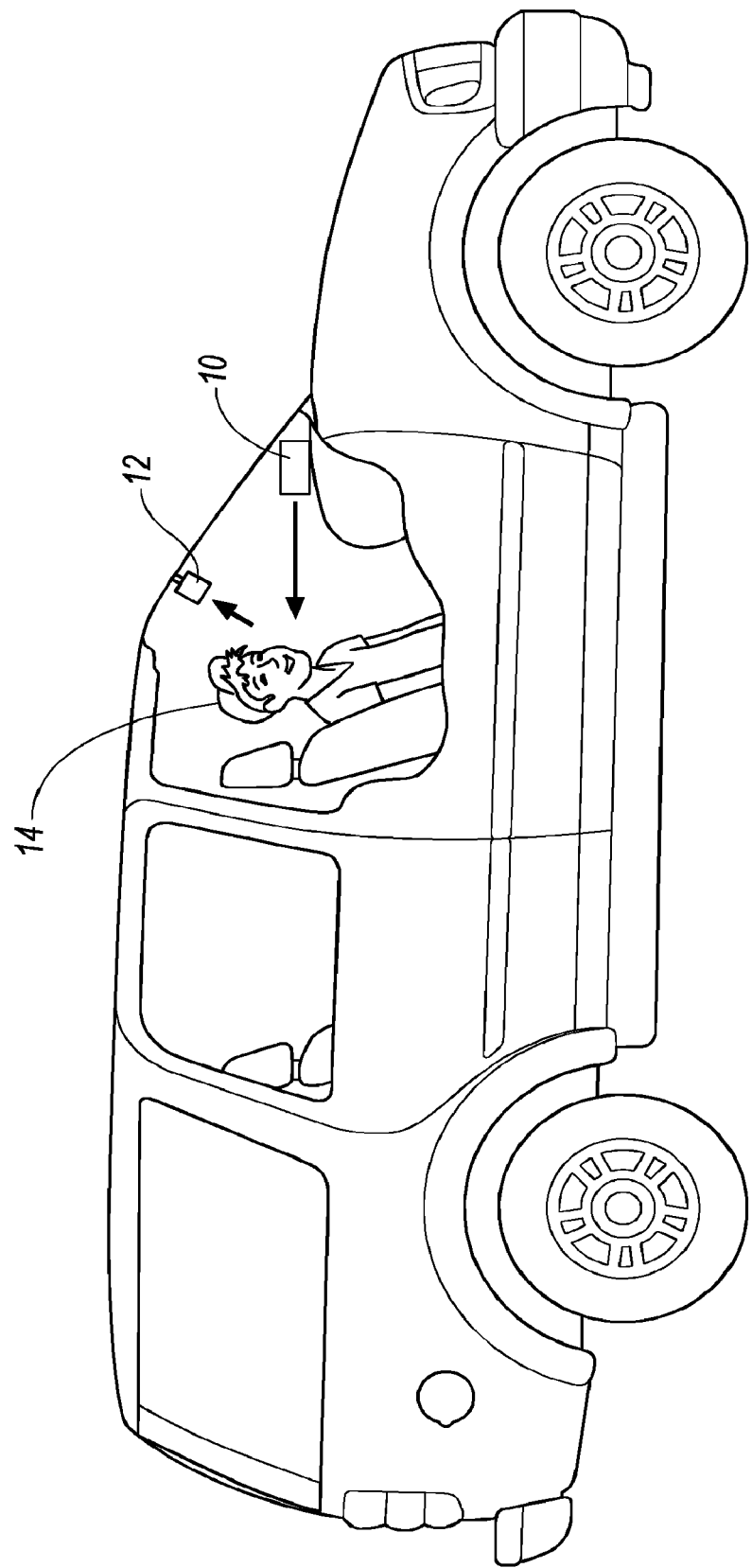
FIG. 1 is a vehicle employing an embodiment of the present invention in the form of a passenger occupant detection system.

FIG. 1 depicts one possible use for the present invention. In this application vehicle subject 14 is a passenger and infrared camera 10 is used to determine if a passenger is in fact present in various locations of the vehicle. If passengers are not present, various strategies may be used in the event of a collision, such as not deploying a side airbag if a passenger is not present within the zone of protection offered by the side airbag. This is just one possible application of the present invention. As mentioned earlier, the present invention has application in driver gaze systems or in any system where the performance of an imaging camera is tightly coupled to the radiance intensity and wavelength of light emitted by an irradiating device.

Figure 2:
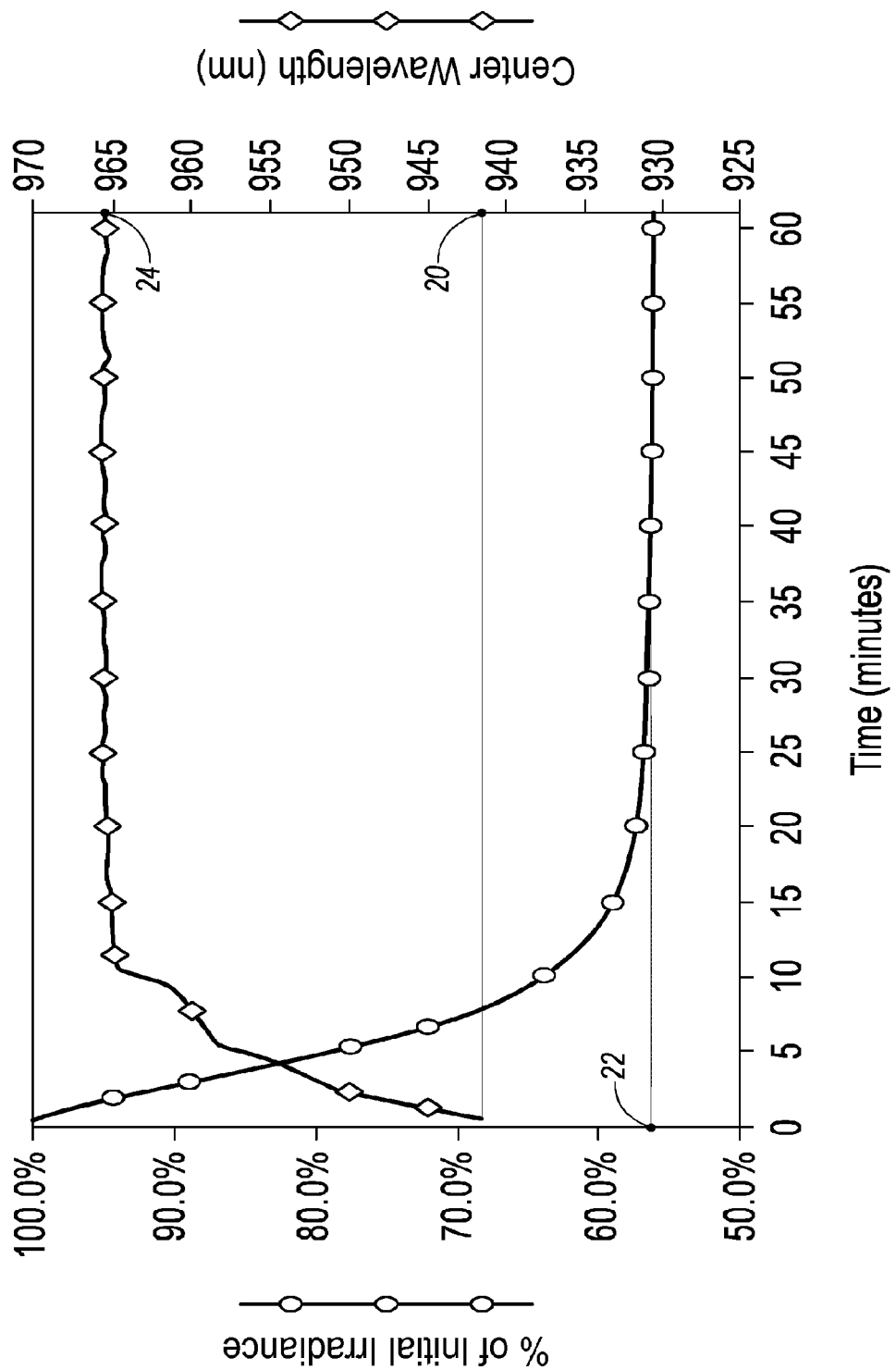
FIG. 2 is a graphical depiction of the relative degradation of irradiance emitted from a LED array bank as the LED array bank heats up and also a depiction of the shift in center wavelength of the irradiance emitted from the LED array bank as the LED array bank heats up.

Now referring to FIG. 2, the efficiency of infrared cameras is highly dependent upon wavelengths of infrared light received by the camera. Many infrared cameras operate at peak efficiency when they receive a range of light that is closely centered about a wavelength of 940 nm. Although it is not difficult to fabricate LED arrays that emit light tightly centered at or around the wavelength matched to infrared cameras, infrared irradiating devices are highly susceptible to temperature drift which skews not only the efficiency of the irradiating device (i.e. its strength of irradiance), but also its ability to fix its output light at a center wavelength which is matched to the peak operating wavelength of the infrared camera. FIG. 2 depicts the typical skewing of irradiance and center wavelength which takes place as an infrared irradiating device heats up.

Initially, when the infrared irradiating device is first powered at its optimal ambient temperature, it, by definition, emits 100 percent of its irradiance. For the particular infrared irradiating device that was tested (Vishay TSAL 6100 940 nm), the emitted light had an initial center wavelength of 942 nm (see reference numeral 20 in FIG. 2). The device under test was allowed to warm up over the next hour. Over that one hour period of time, the irradiance dropped to less than sixty percent (of initial irradiance—see reference numeral 22 in FIG. 2) and the center wavelength of the light emitted from the irradiating device shifted from its initial center wavelength of approximately 942 nm to a center wavelength end point of over 965 nm (see reference numeral 24). Thus, as an infrared LED warms up, two factors act to detract from the efficient use of an infrared camera used in conjunction with the infrared irradiating device. Firstly, the irradiance of the infrared LED device degrades and secondly the center wavelength of infrared light emitted from the LED device, shifts from a desirable center wavelength (approximately 940 nm) to a less desirable center wavelength (slightly over 965 nm). The present invention is employed to use the temperature controls provided by the HVAC system of the vehicle to control the temperature of the infrared LED irradiating device such that the undesirable degradation in irradiance is minimized and the undesirable shift in center wavelength of light emitted from the infrared irradiating device is also minimized.

Figure 3:
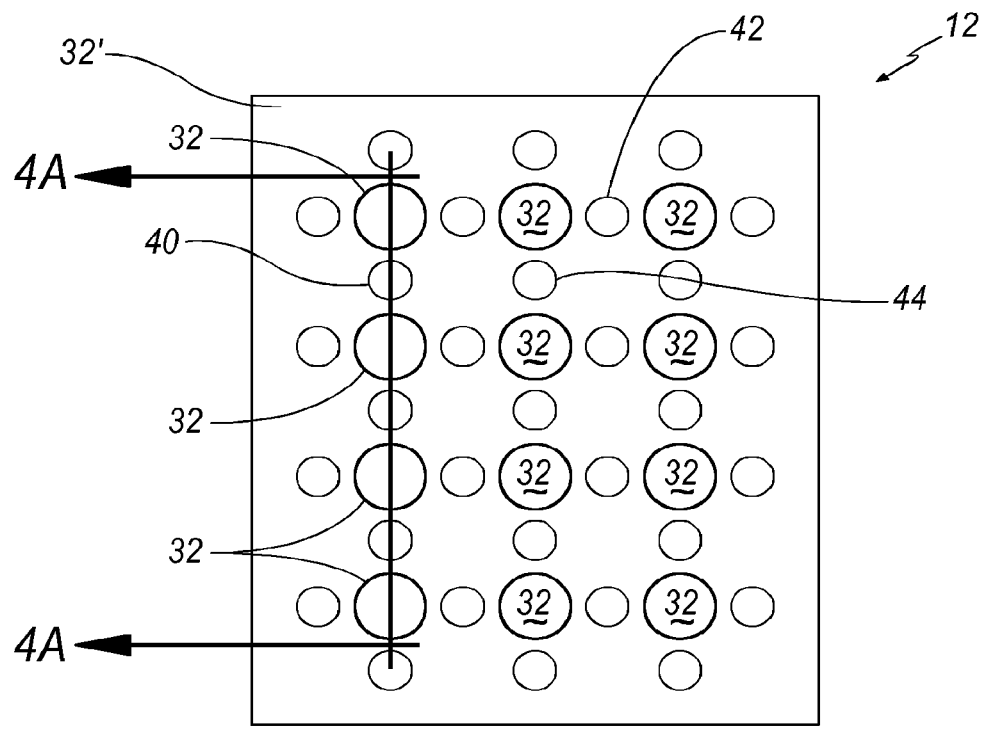
FIG. 3 is a front elevational view of an embodiment of the infrared LED array bank of the present invention.
Figure 5:
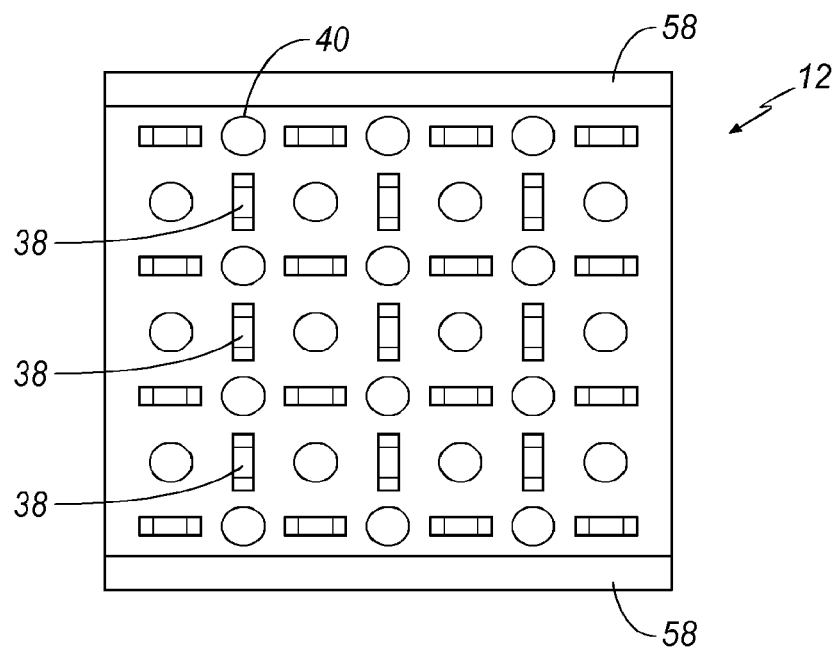
FIG. 5 is a rear elevational view of the infrared array of FIG. 3.

Now referring to FIG. 3, in a first embodiment, the present invention includes an infrared array 12. Infrared array 12 is shown in FIG. 3 as a generally planar arrangement wherein LEDs are arranged in a generally planar relationship; however, other geometrical arrangements of LEDs such as spherical, cylindrical, cubical, and the like are contemplated by the present invention.

Figure 4A:
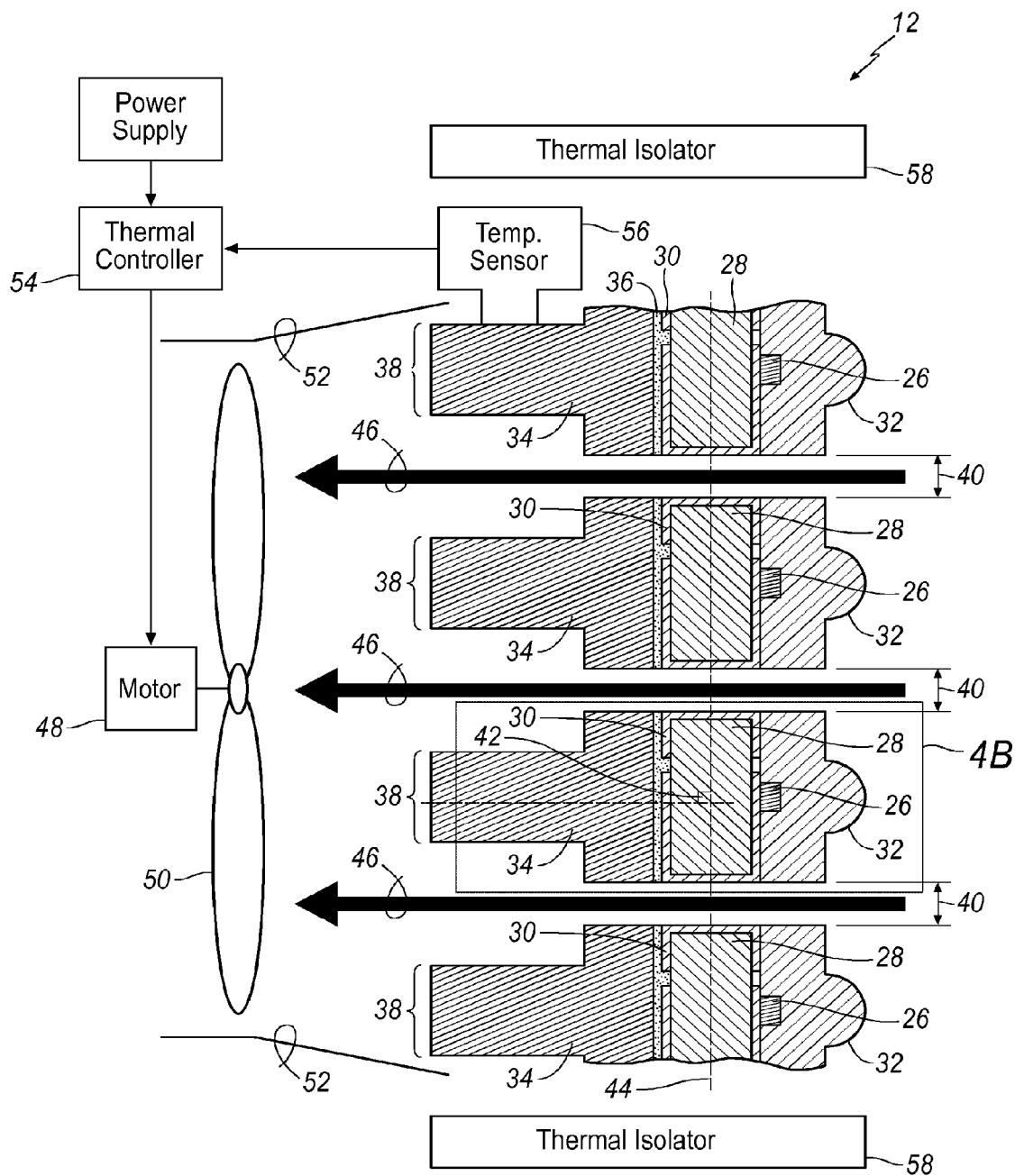
FIG. 4A is a cross-sectional view of the LED array bank taken substantially through lines 4A-4A of FIG. 3 with additional supplemental thermal control components.
Figure 4B:
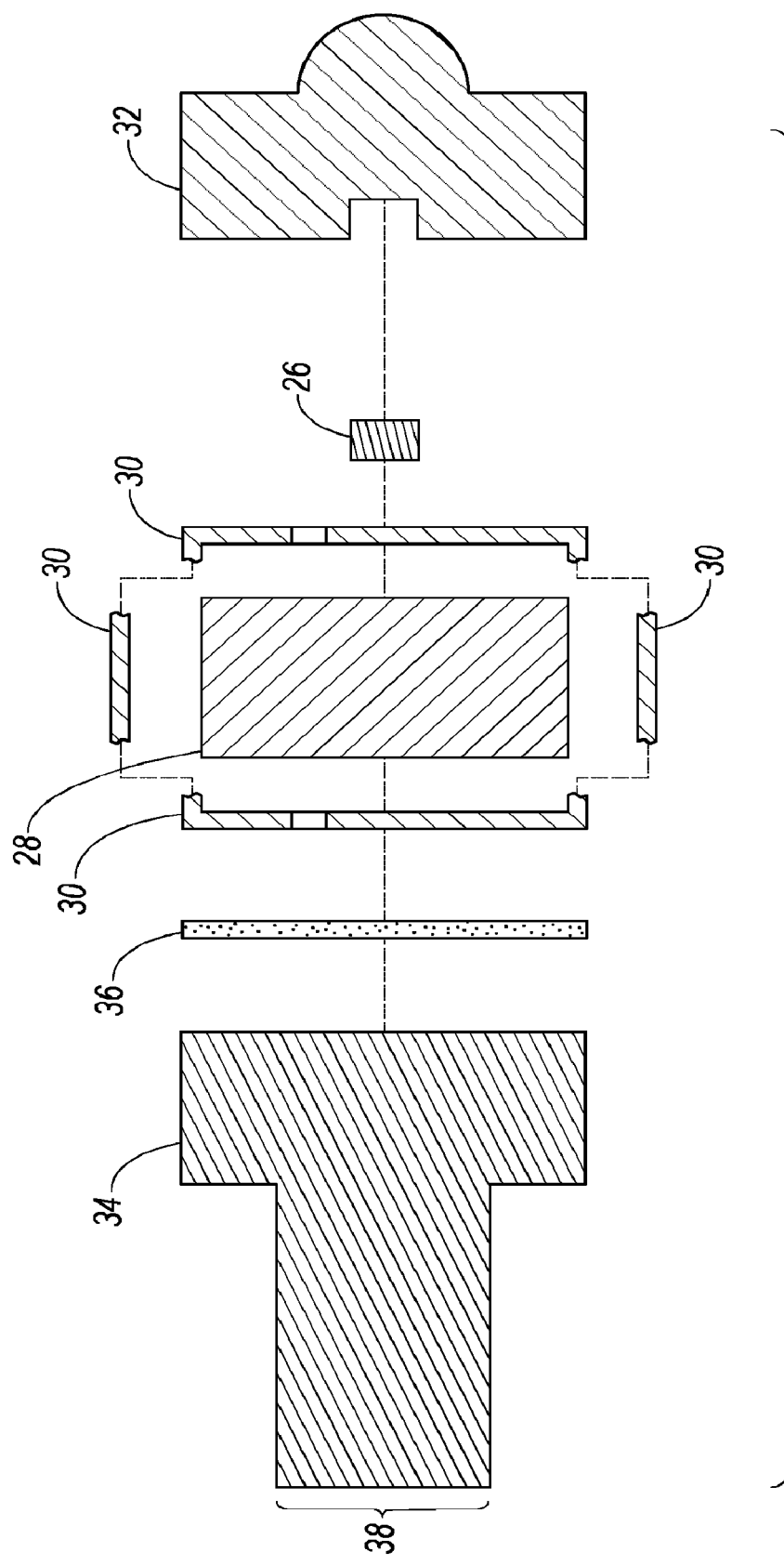
FIG. 4B is an exploded view of one of the LEDs (and surrounding support structure) of the infrared array bank of FIG. 4A.

Now referring to FIG. 3, FIG. 4A, and FIG. 4B, infrared array 12 is composed of a plurality of LEDs 26 mounted to a common substrate 28. LED 26 can be comprised of any number of materials (e.g. silicon) commonly used for fabricating semiconductors (if the LEDs are formed directly to an integrated circuit (IC) in the IC fabrication process). Also, substrate 28 may be comprised of any material used for fabricating printed circuit boards such as silicon nitride (SiN), alumina (AlN), FR4 and the like. Substrate 28 may be covered in part, or in whole, by an electrically conductive material 30 (such as a copper or aluminum cladding), to provide one or more electrical circuit paths to LED 26 or other electronic components that may be mounted to substrate 28. Lens 32 is disposed over LED 26 and forms a device for directing the path of light emitted from LED 26. Lens 32 can be formed directly on substrate 28 during the process of fabricating infrared array 12 or in the alternative, lens 32 may be fabricated separately and then subsequently overlaid upon substrate 28 and LED 26. Each lens 32 may be separate from one another or two or more lenses may be fabricated in a common lens layer 32'.

Substrate 28 is placed in thermal contact with manifold 34. Manifold 34 forms a heat sink for drawing heat away from substrate 28. In order to maximize the thermal efficiency of manifold 34, optionally, a thermally conductive material 36 can be placed between manifold 34 and substrate 28. Manifold 34 can be fashioned with a plurality of fins 38 so that the surface area of manifold 34 can be increased thereby increasing the capacity of manifold 32 to shed heat. Walls formed in manifold 34 define in part, passages 40.

Infrared array 12 preferably includes passages 40 that pass between adjacent lenses 32 (through lens sheet 32'), through substrate 28, and through manifold heat sink 34. These passages may be formed through infrared array 12 at any location which does not interfere with the operation of LED 12 or the function of lens 32. Walls formed in substrate 28 define, in part, passages 40. In the embodiment shown in FIGS. 3 and 4A, passages 40 are placed between horizontally adjacent LEDs (exemplified at 42 in FIG. 3) and also placed between vertically adjacent LEDs (exemplified at 44 in FIG. 3). Other or additional placement of openings 40 is contemplated by the present invention such as the placement of openings 44 between diagonally adjacent LEDs.

The fin portion 38 of manifold 34 can extend at a 90° angle 42 from the plane 44 of substrate 28. Additionally, it is contemplated in the present invention that other manifold extension geometries can be used. For example, fin 38 can extend at a 45° angle if packaging depth is an issue.

Air movement 46 can be accomplished in any number of ways through passages 40. For example, depending on the heat load generated by LEDs 26, simple air movement caused by convection may be sufficient to cool manifold 34. In instances where convection cooling is insufficient to remove the heat absorbed by manifold 34, a motor 48 and fan 50 assembly may be used to move air through passages 40. If packaging constraints do not allow motor/fan assembly 48, 50 to be placed directly adjacent manifold 34, a conduit 52 can be interposed between fan 50 and passages 40. By using conduit 52 in this manner, fan 50 may be remotely mounted from passages 40.

The most simplest approach for using motor 48 and fan 50 to cool manifold 34 is to simply operate the motor/fan assembly 48, 50 100% of the time. Although this is the most simplest approach, it is not the most energy efficient approach. In an alternative embodiment, motor 48 is connected to thermal controller 54. Thermal controller 54 is capable of varying the speed at which motor 48 turns. Thermal controller 54 is coupled to thermal sensor 56. Thermal sensor 56 is mounted to a portion of manifold 34 and is capable of sensing the temperature of manifold 34 and generating an electrical signal which is indicative of the temperature of manifold 34. Thermal controller 54 may be adapted to control the speed of motor 48 in proportion to the temperature deviation between the temperature sensed by sensor 56 and a predetermined thermal set point. The predetermined thermal set point can be preset within thermal controller 54 or it can be externally set and/or externally adjustable.

In some applications, it may be desirable to thermally isolate infrared array 12 from its surrounding environment. This may be the case when infrared array 12 is disposed adjacent to components whose temperature deviates significantly (higher or lower) from the ambient temperature of the vehicle. In such applications, thermal isolators 58 can be used as thermal insulation members to impede heat flow to or from infrared array 12.

Figure 6:
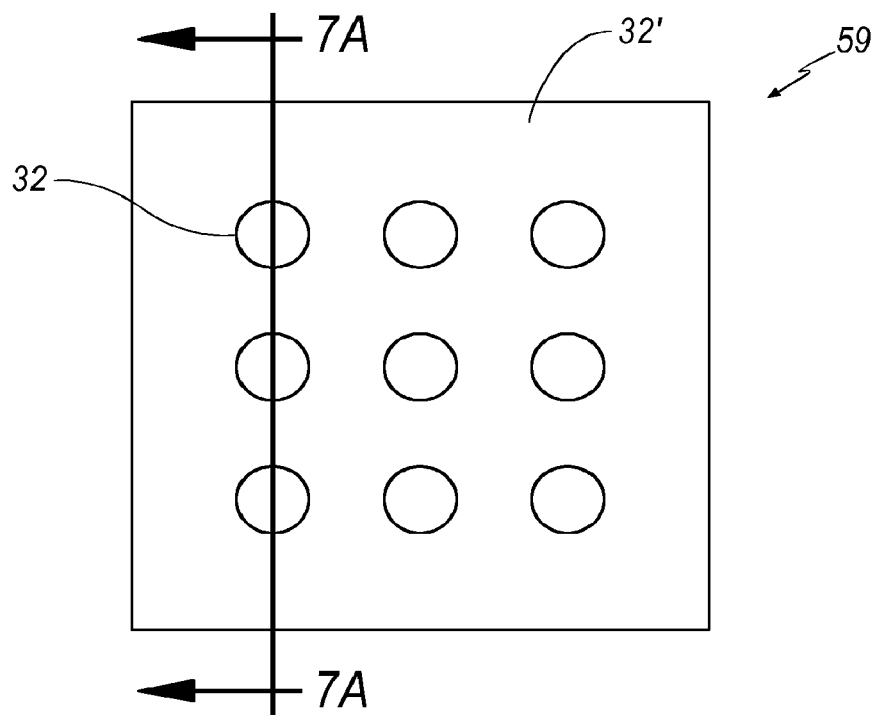
FIG. 6 is a front elevational view of another embodiment of the infrared LED array bank of the present invention.

Now referring to FIG. 6, in another embodiment of the present invention, infrared array 60 is formed without openings 40 (which in the embodiment of FIGS. 3-6, pass through lens layer 32'). In the alternative embodiment set forth in FIGS. 6-8, manifold 34 includes a plurality of pegs 60 that extend from manifold 34. Each peg 60 is designed to reside within a respectively associated aperture 62 formed by adjacent side walls 29' of substrate 28 (see aperture 62 in FIG. 7B). Substrate 28 can optionally include a cladding material 30 (such as electrically conductive metal). Aperture 62 should be formed sufficiently large to eliminate cracking of peg 60 or the substrate 28 due to the differences in the coefficient of thermal expansion between manifold material 34 and substrate material 28. Optionally, thermally conductive paste 36 (or the like) may be disposed between manifold 34 and substrate 28 in order to enhance the heat transfer from substrate 28 to manifold 34 and also to enhance the heat flow from substrate 28 to peg 60.

Figure 8:
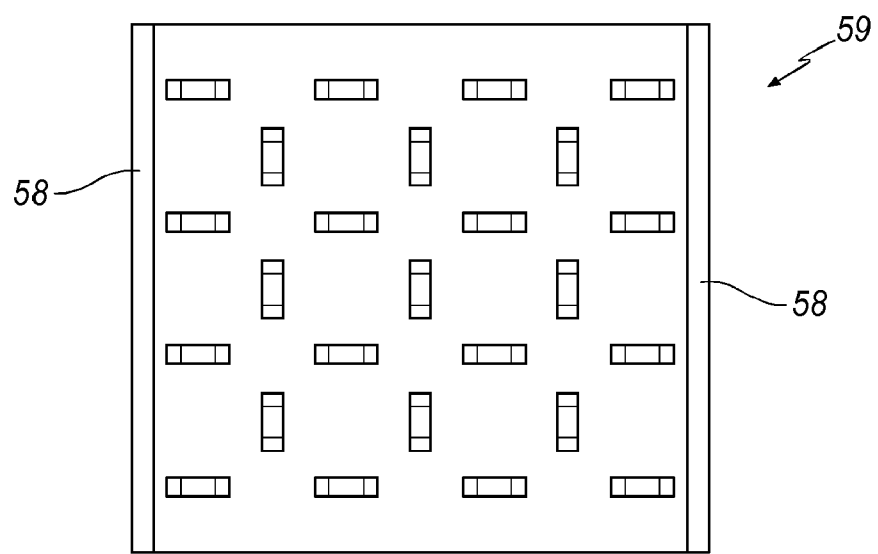
FIG. 8 is a rear elevational view of the infrared array of FIG. 7.
Figure 7A:
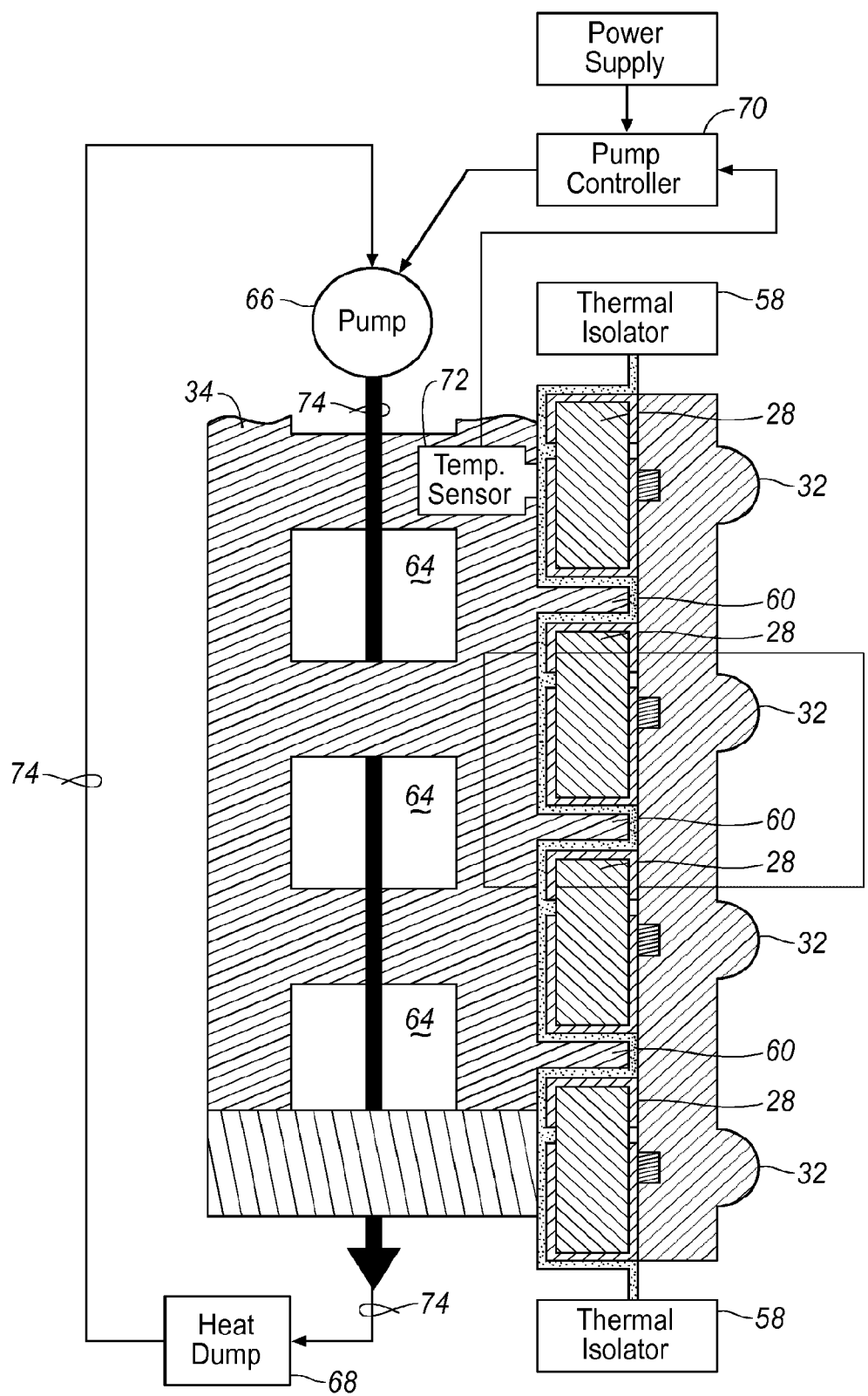
FIG. 7A is a cross-sectional view of the LED array bank taken substantially through lines 7A-7A of FIG. 6 supplemented with thermal control components.
Figure 7B:
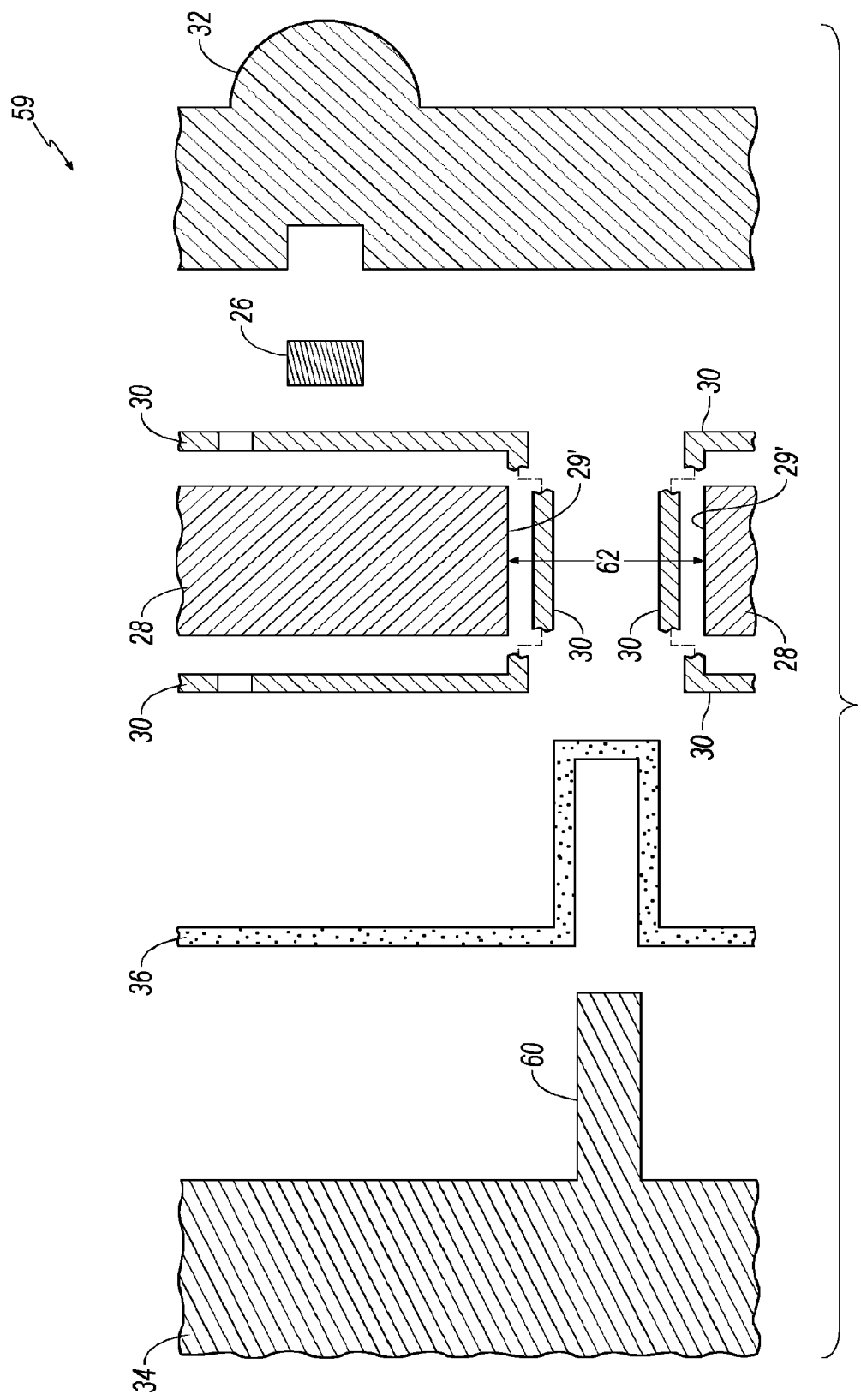
FIG. 7B is an exploded view of section 7B called out in FIG. 7A.

In the embodiment shown in FIGS. 6-8, a supplemental fluid cooling scheme may be used to cool manifold 34. The fluid medium can be any fluid (liquid or gas) effective for transferring heat. Specifically, manifold 34 may be fashioned with one or more chambers 64 which are in fluid connection with one another and also are in fluid connection with a cooling circuit comprised of pump 66, one or more fluid conduit portions 74, and a heat dump device 68. Depending on the heat load generated by infrared array 60, the heat dump device 68 can be anything which is capable of dumping the heat load generated by infrared array 60 including a simple copper tube, a radiating device (similar to that used in automotive radiators) and the like. In the simplest control scheme, pump 66 is allowed to run continuously offering maximum cooling to manifold 34. In an alternative, more sophisticated control scheme, pump 66 is coupled to pump controller 70. Pump controller 70 is adapted to regulate the pumping action of pump 66 which, in turn, controls the flow of fluid circulated by pump 66 through circuit (64, 66, 68, 74). Pump controller 70 monitors the temperature of substrate 28 by way of one or more temperature sensors 72 placed in thermal contact with substrate 28 or manifold 34. Pump controller can use any number of schemes for controlling the activity of pump 66. One such approach that may be used by a pump controller is to monitor the temperature difference between the temperature sensed by sensor 72 and a predetermined temperature.

When this temperature difference exceeds a predetermined threshold, pump controller would activate pump 66 thereby circulating fluid through circuit 64, 66, 68 and 74. Other, more sophisticated control schemes, could be employed such as activating pump 66 in proportion to the magnitude of the temperature difference between temperature sensor 72 and a predetermined temperature. Temperature control approaches such as these are well known to those skilled in the art and any number of control schemes may be used.

It will be understood that various modifications or additions may be made to the embodiments chosen here to illustrate the present invention without departing from the spirit of the present invention. Accordingly, it is to be understood that the subject matter sought to be afforded protection hereby shall be deemed to extend to the subject matter defined in the appended claims including all fair equivalents thereof.

What is claimed as new and desired to be protected by Letters Patent of the United States is:

1. A LED array cooling system, comprising:
    a LED array,
    a substrate attached to said LED array, wherein said LED array includes a plurality of walls that at least in part define a plurality of passages through said LED array,
    a heat sink thermally coupled to the substrate, wherein the heat sink further includes heat sink walls that at least in part define the plurality of passages, and
    a motor and a fan for moving air through said passages.

2. The LED array cooling system of claim 1, wherein said substrate supports a plurality of LEDs, and wherein the substrate includes substrate walls that at least in part define said plurality of passages.

3. The LED array cooling system of claim 2, wherein said heat sink includes a plurality of pegs, wherein each peg in said plurality of pegs is adapted to reside in a portion of one passage in said plurality of passages.

4. The LED array cooling system of claim 2, wherein said LED array further includes a lens layer having a plurality of lens layer walls, wherein said plurality of lens layer walls at least in part define said plurality of passages.

5. The LED array cooling system of claim 2, wherein said substrate is at least partially coated with an electrically conductive cladding.

6. The LED array cooling system of claim 1, wherein the LED array further includes a lens.

7. The LED array cooling system of claim 1, further including a layer of thermally conductive material disposed between said heat sink and said substrate.

8. The LED array cooling system of claim 1, wherein said LED array is at least partially thermally isolated from structures adjacent to said LED array.

9. The LED array cooling system of claim 1, wherein said heat sink includes fins that extend generally perpendicularly from a plane defined by said substrate.

10. The LED array cooling system of claim 1, wherein said heat sink includes fins that extend at an angle that is not generally perpendicular from a plane defined by said substrate.

11. The LED array cooling system of claim 1, further including a conduit coupled between the fan and the passages.

12. The LED array cooling system of claim 1, further comprising a controller and a temperature sensor for sensing the temperature of said heat sink or said substrate and controlling said temperature to a thermal set point.

13. The LED array cooling system of claim 1, wherein said LED is comprised of silicon.

14. The LED array cooling system of claim 1, wherein said substrate is fabricated from silicon nitride, alumina, or FR4.

* * * * *